United States Patent
Allan et al.

(10) Patent No.: US 9,692,427 B2
(45) Date of Patent: Jun. 27, 2017

(54) APPARATUS AND METHODS FOR PHASE-LOCKED LOOPS WITH SOFT TRANSITION FROM HOLDOVER TO REACQUIRING PHASE LOCK

(71) Applicant: Hittite Microwave Corporation, Chelmsford, MA (US)

(72) Inventors: Gordon John Allan, Ottawa (CA); Justin L. Fortier, Ottawa (CA)

(73) Assignee: HITTITE MICROWAVE LLC, Chelmsford, MA (US)

( * ) Notice: Subject to any disclaimer, the term of this patent is extended or adjusted under 35 U.S.C. 154(b) by 0 days.

(21) Appl. No.: 14/610,025

(22) Filed: Jan. 30, 2015

(65) Prior Publication Data
US 2015/0222273 A1 Aug. 6, 2015

Related U.S. Application Data

(60) Provisional application No. 61/933,971, filed on Jan. 31, 2014.

(51) Int. Cl.
*H03L 7/08* (2006.01)
*H03L 7/10* (2006.01)
(Continued)

(52) U.S. Cl.
CPC ............. *H03L 7/08* (2013.01); *H03L 7/10* (2013.01); *H03L 7/101* (2013.01); *H03L 7/14* (2013.01);
(Continued)

(58) Field of Classification Search
CPC ... H03L 1/028; H03L 5/00; H03L 7/08; H03L 7/10; H03L 7/101; H03L 7/143; H03L 7/146; H03L 7/23
(Continued)

(56) References Cited

U.S. PATENT DOCUMENTS 6,259,328 B1 * 7/2001 Wesolowski ............ H03L 7/143
327/147
2002/0021178 A1 * 2/2002 Yoshida .................. H03L 7/095
331/17

(Continued)

FOREIGN PATENT DOCUMENTS

EP 0 652 642 A1 5/1995
EP 1 006 662 A2 6/2000

OTHER PUBLICATIONS

Extended European Search Reported received in European Patent Application No. 15153213.2, dated Jun. 12, 2015, in 5 pages.
(Continued)

*Primary Examiner* — John Poos
(74) *Attorney, Agent, or Firm* — Knobbe Martens Olson & Bear LLP

(57) ABSTRACT

Provided herein are apparatus and methods for phase-locked loops (PLLs). In certain configurations, a clock system includes a PLL, a control circuit, and a holdover circuit that is electrically coupled to an input of the PLL's loop filter via a holdover switch and a variable resistor. The control circuit generates an input clock signal for the PLL based on a selected reference clock signal. When the control circuit determines that the selected reference clock signal is unreliable, the control circuit disables the PLL's feedback loop and turns on the holdover switch. After the selected reference clock signal is changed or otherwise becomes reliable, the control circuit enables the PLL's feedback loop while keeping the holdover switch turned on, and controls a resistance of the variable resistor over time to provide a soft transition from holdover to reacquiring phase lock.

24 Claims, 5 Drawing Sheets

(51) Int. Cl.
    *H03L 7/14*      (2006.01)
    *H03L 7/23*      (2006.01)
(52) U.S. Cl.
    CPC .............. *H03L 7/143* (2013.01); *H03L 7/146* (2013.01); *H03L 7/23* (2013.01)
(58) Field of Classification Search
    USPC ........................................ 327/147, 156, 158
    See application file for complete search history.

(56) References Cited

U.S. PATENT DOCUMENTS

2010/0244914 A1* 9/2010 Kim et al. .............. H03L 7/085
                                                      327/157
2012/0280735 A1* 11/2012 Zhang ..................... H03L 7/146
                                                      327/184

OTHER PUBLICATIONS

Office Action Issued in Chinese Application No. 201510047905.9, dated May 4, 2017, in 9 pages.

* cited by examiner

APPARATUS AND METHODS FOR PHASE-LOCKED LOOPS WITH SOFT TRANSITION FROM HOLDOVER TO REACQUIRING PHASE LOCK

CROSS-REFERENCE TO RELATED APPLICATIONS

The present application claims priority to U.S. Provisional Patent Application No. 61/933,971, filed Jan. 31, 2014, titled "JITTER ATTENUATOR CIRCUIT WITH SOFT TRANSITION FROM HOLD-OVER TO RE-ACQUIRING PHASE LOCK," the entirety of which is hereby incorporated herein by reference.

BACKGROUND

Field

Embodiments of the invention relate to electronic circuits, and more particularly, to phase-locked loops (PLLs).

Description of the Related Technology

Phase-locked loops (PLLs) are used in a variety of applications for generating an output clock signal having a controlled phase and frequency relationship to a reference clock signal. PLLs can be used in, for example, frequency synthesizers, telecommunications systems, and/or chip-to-chip communication.

Clock generation circuits frequently include a PLL used to lock an output clock signal generated by the PLL's voltage controlled oscillator (VCO) to the phase of an incoming reference clock signal. For instance, a high precision tunable oscillator can be phase-locked to a noisy reference clock signal, and the PLL can operate to suppress phase noise and to attenuate jitter.

SUMMARY

In one aspect an apparatus includes a first phase-locked loop (PLL), a control circuit, a holdover circuit, and a variable resistor. The first PLL is configured to receive an input clock signal, and includes a loop filter. The control circuit is configured to receive one or more reference clock signals and to generate the input clock signal based on the one or more reference clock signals. The holdover circuit is configured to generate a holdover voltage at an output. The variable resistor is electrically connected in series between the output of the holdover circuit and an input to the loop filter. The control circuit is further configured to generate a resistance control signal to control a resistance of the variable resistor.

In another aspect, a method of clock signal generation includes generating an input clock signal for a PLL using a control circuit, generating a holdover voltage at an output of a holdover circuit that is electrically connected to an input of a loop filter of the PLL via a variable resistor, and controlling a resistance of the variable resistor using the control circuit.

In another aspect, a clock system includes a PLL, a control circuit, a holdover circuit, and a variable resistor. The PLL is configured to receive an input clock signal, and includes a loop filter. The control circuit is configured to receive one or more reference clock signals and to generate the input clock signal. The control circuit is further configured to control the PLL to one of a plurality of operating modes including a holdover mode and a phase locking mode. The holdover circuit is configured to generate a holdover voltage at an output. The variable resistor is electrically connected between the output of the holdover circuit and an input to the loop filter. The control circuit is further configured to control a resistance of the variable resistor.

DETAILED DESCRIPTION OF EMBODIMENTS

Figure 1:
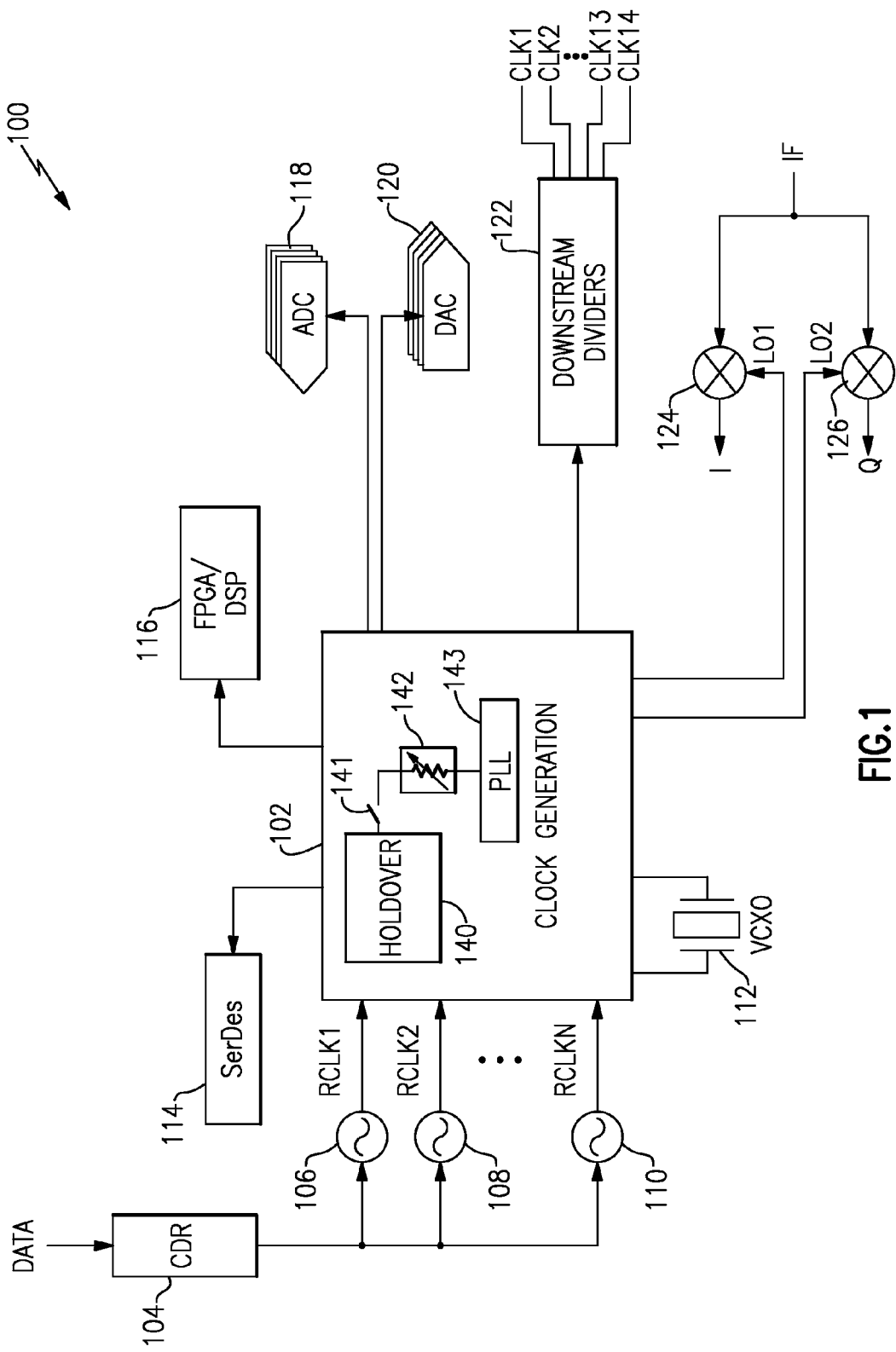
FIG. 1 is a schematic diagram of a clock system according to one embodiment.

The following detailed description of embodiments presents various descriptions of specific embodiments of the invention. However, the invention can be embodied in a multitude of different ways as defined and covered by the claims. In this description, reference is made to the drawings in which like reference numerals may indicate identical or functionally similar elements.

A phase-locked loop (PLL) can include a holdover circuit to control the PLL's operation during periods when an active reference clock signal becomes lost or invalid. In one example, the PLL can receive two or more reference clock signals, and can switch from a first reference clock signal to a second reference clock signal when the first reference clock signal is determined to be unreliable. During transition from one reference clock signal to another, the PLL can operate in a holdover mode in which the tuning voltage of the PLL's VCO can be held substantially constant by the holdover circuit to inhibit the VCO's oscillation frequency from changing. During holdover, the PLL's feedback loop can be disabled, such as by disconnecting the output of the PLL's charge pump from the input of the PLL's loop filter. Thus, the PLL can operate open-loop during holdover. In another example, a PLL can receive a single reference clock signal, and can operate during holdover when the reference clock signal is determined to be unreliable. The PLL can remain the holdover mode until the reference clock signal is determined to be reliable.

Communication systems, such as those operating in a network or cellular infrastructures, can be specified to generate a stable clock signal generated from one or more noisy reference clock signals. For instance, one or more of the communication system's reference clock signals can correspond to a clock signal recovered from a noisy and/or intermittent data stream using a clock and data recovery (CDR) circuit. Since the reference clock signals can be noisy, the communication system can include a cascade of two or more PLLs to meet overall phase noise and/or jitter specifications. For example, a first PLL can be used to generate a stable reference clock signal from a noisy reference clock signal, and the second PLL can provide frequency synthesis or multiplication using the stable reference clock signal.

Generating a reference clock signal from a noisy signal source can result in the reference clock signal regularly becoming lost or invalid. Thus, multiple reference clock signals can be provided to a PLL for redundancy. In one example, when a particular reference clock signal is determined to be unreliable, the PLL's reference clock signal can be changed or switched and the PLL's holdover circuit can maintain the oscillation frequency of the PLL's VCO substantially constant during the change of reference clock signals. After the reference clock signal is switched, the PLL can reacquire phase-lock. In another example, a PLL operates in holdover while a reference clock signal is unreliable, and reacquires phase-lock to the reference clock signal once the reference clock signal becomes reliable.

During the transition from holdover to reacquiring phase lock, absent compensation a tuning voltage of the PLL's VCO can undergo a large signal swing, thereby causing the frequency of the PLL's output clock signal to have large transient variations. For instance, the PLL can be a low-jitter PLL having a loop filter designed for low loop bandwidth, which in turn causes a slow loop response. The slow loop response can cause the PLL's output clock signal to have large frequency variations during the transient period when the PLL reacquires phase lock.

Accordingly, limitations of the PLL in recovering from the transition from holdover to reacquiring phase lock can cause transient frequency variation, namely frequency perturbations, in a PLL's output clock signal. However, such transient frequency variation may be unacceptable for certain applications and/or clocking systems under strict timing constraints. For instance, in cellular infrastructure applications, the PLL's output clock signal can be used to modulate or demodulate radio frequency signals, and frequency perturbations can generate spurious emissions, transmissions out-of-band, communication errors, and/or dropped calls.

Provided herein are apparatus and methods for PLLs with soft transition from holdover to reacquiring phase lock. In certain configurations, a clock system includes a PLL, a control circuit, and a holdover circuit that is electrically coupled to an input of the PLL's loop filter via a holdover switch and a variable resistor. The control circuit generates an input clock signal for the PLL based on a selected reference clock signal. When the control circuit determines that the selected reference clock signal is unreliable, the control circuit disables the PLL's feedback loop and turns on the holdover switch to provide an electrical connection from the output of the holdover circuit to the input of the PLL's loop filter through the variable resistor. After the selected reference clock signal is changed or otherwise becomes reliable, the control circuit enables the PLL's feedback loop while keeping the holdover switch turned on, and controls a resistance of the variable resistor over time to provide a soft transition from holdover to reacquiring phase lock. For example, the control circuit can incrementally increase the variable resistor's resistance during the transition such that the holdover circuit sinks or sources a smaller portion of the charge pump's output current over time. Thus, operation of the holdover circuit is gradually phased out, and the PLL operates with a soft transition from holdover to reacquiring phase lock.

Configuring a PLL to have a soft transition from holdover to reacquiring phase lock can enhance the clock system's performance. For example, using a soft transition can prevent large voltage perturbations in the VCO's tuning voltage, which can limit a change to the VCO's oscillation frequency during the transition. In contrast, a PLL that operates without soft transition may have a VCO tuning voltage that reaches a power high or power low supply voltage rail during the transition from holdover to reacquiring phase lock. Accordingly, the PLL's herein can exhibit enhanced transient performance, increased stability, and/or smaller phase noise and jitter during the transition from holdover to reacquiring phase lock.

As used herein, a "variable resistor" refers to a resistor having a controllable resistance, including not only analog controlled resistors, but also digitally controlled resistors such as programmable/selectable resistors.

FIG. 1 is a schematic diagram of a clock system 100 according to one embodiment. The clock system 100 includes a clock generation circuit 102, a clock and data recovery (CDR) circuit 104, a first reference clock generator 106, a second reference clock generator 108, a third reference clock generator 110, a high precision tunable oscillator or VCXO 112, a serializer/deserializer (SerDes) circuit 114, a field programmable gate array (FPGA)/digital signal processor (DSP) 116, analog-to-digital converter (ADC) circuits 118, digital-to-analog converter (DAC) circuits 120, downstream dividers 122, a first mixer 124, and a second mixer 126.

The clock system 100 can be used in a variety of applications, including, for example, cellular infrastructure applications. For example, the clock system 100 can represent a portion of a base station.

As shown in FIG. 1, the clock generation circuit 102 receives a plurality of clock reference clock signals including a first reference clock signal RCLK1, a second reference clock signal RLCK2, and a third clock signal RCLKN. Although FIG. 1 illustrates the clock generation circuit 102 as receiving three reference clock signals, the clock generation circuit 102 can receive more or fewer reference clock signals. For example, in one embodiment the clock generation circuit 102 receives N reference clock signals, where N is selected to be in the range of about 1 to about 4. In the illustrated configuration, the reference clock signals are derived from the CDR circuit 104. For example, the reference clock signals can correspond to recovered clock signals from clock and data recovery operations of the CDR circuit 104 on a data stream (DATA). However, other configurations are possible, such as configurations in which all or part of the reference clock signals are generated in other ways. In one embodiment, the reference clock signals include at least one reference clock signal generated using a reference oscillator, such a free-running oscillator that operates open-loop.

In the illustrated configuration, the clock generation circuit 102 can generate output clock signals based on a selected or active reference clock signal chosen from the reference clock signals RCLK1-RCLKN. For example, the clock generation circuit 102 can use one active or primary reference signal, for example, the first reference clock signal RCLK1, which is used to generate the output clock signals. Additionally, the other reference clock signals RCLK2-RCLKN can serve as back-up clock reference signals should the first reference clock signal RCLK1 become invalid or dropped.

The clock generation circuit 102 can generate stable high-frequency low-jitter clock signals for a variety of circuits. For example, in the illustrated configuration, the clock generation circuit 102 generates clock signals for the SerDes circuit 114, the FPGA/DSP 116, the ADC circuits 118, the DAC circuits 120, the downstream dividers 122, and first and second mixers 124, 126 for modulating in-phase (I) and quadrature-phase (Q) components of an intermediate frequency (IF) signal. In certain configurations, one or more output clock signals generated by the clock generation circuit 102 can be further processes to generate additional clock signals. For example, in the illustrated configuration, the downstream dividers 122 provide division operations to generate a plurality of clock signals (CLK1, CLK2, . . . , CLK13, CLK14, in this example). Although one example of circuits that can receive clock signals form the clock generation circuit 102 has been shown, the clock generation circuit 102 can generate clock signals for other circuitry. Thus, the illustrated clock system 100 depicts various non-limiting examples of circuitry that can receive clock signals from the clock generation circuit 102.

The output clock signals generated by the clock generation circuit 102 can be specified to have high stability, low phase noise, and/or low jitter. However, at least a portion of the reference clock signals RCLK1, RCLK2, and RCLKN can be noisy and/or intermittent.

To meet or exceed performance specifications, the clock generation circuit 102 can include a low loop bandwidth PLL 143, which can be used to lock the phase of the VCXO 112 to the selected reference clock signal. In certain configurations, the VCXO 112 comprises a tunable crystal oscillator. However, the teachings herein are applicable to other types of controllable oscillators, including, for example, inductor-capacitor (LC) tank oscillators, ring oscillators, and/or rotary traveling wave oscillators (RTWOs).

When the loop bandwidth of the PLL 143 is relatively low, for instance less than 200 Hz, the clock generation circuit 102 can generate output clock signals having low phase noise and/or jitter relative to that of the selected reference clock signal. Although one example of loop bandwidth has been provided, other loop bandwidths are possible, including, for example, loop bandwidths chosen for a particular application and/or performance specification.

In certain configurations, the clock generation circuit 102 includes a cascade of PLLs, and the low loop bandwidth PLL 143 serves as a jitter attenuator that provides a stable reference clock signal for a second or high loop bandwidth PLL, which can have a loop bandwidth greater than that of the low loop bandwidth PLL 143. The high loop bandwidth PLL can generate output clock signals that serve as stable high-frequency low-jitter signals for a variety of circuitry, such as cellular infrastructure circuitry.

As shown in FIG. 1, the clock generation circuit 102 includes a holdover circuit 140, a holdover switch 141, and a variable resistor 142. When the first reference clock RCLK1 becomes unreliable or invalid, the holdover switch 141 can be closed or turned on to place the low loop bandwidth PLL 143 into holdover, in which an oscillation frequency of the VCXO 112 is maintained substantially constant while the selected reference clock signal is changed. For example, the feedback loop of the low loop bandwidth PLL 143 can be disabled, the holdover switch 141 can be turned on, and a tuning voltage at the input of the VCXO 112 can be held substantially constant by the holdover circuit 140.

After the reference clock signal has been changed, the low loop bandwidth PLL 143 can reacquire phase lock with the updated reference clock signal. Additionally, while the holdover switch 141 remains turned on and the feedback loop of the PLL 143 is enabled, the resistance of the variable resistor 142 is controlled over time to provide the PLL 143 with a soft transition from holdover to reacquiring phase lock. For example, the variable resistor's resistance can be incrementally increased during the transition from holdover to reacquiring phase lock such that operation of the holdover circuit 141 is gradually phased out, and the PLL 143 operates with a soft transition from holdover to reacquiring phase lock.

Figure 2:
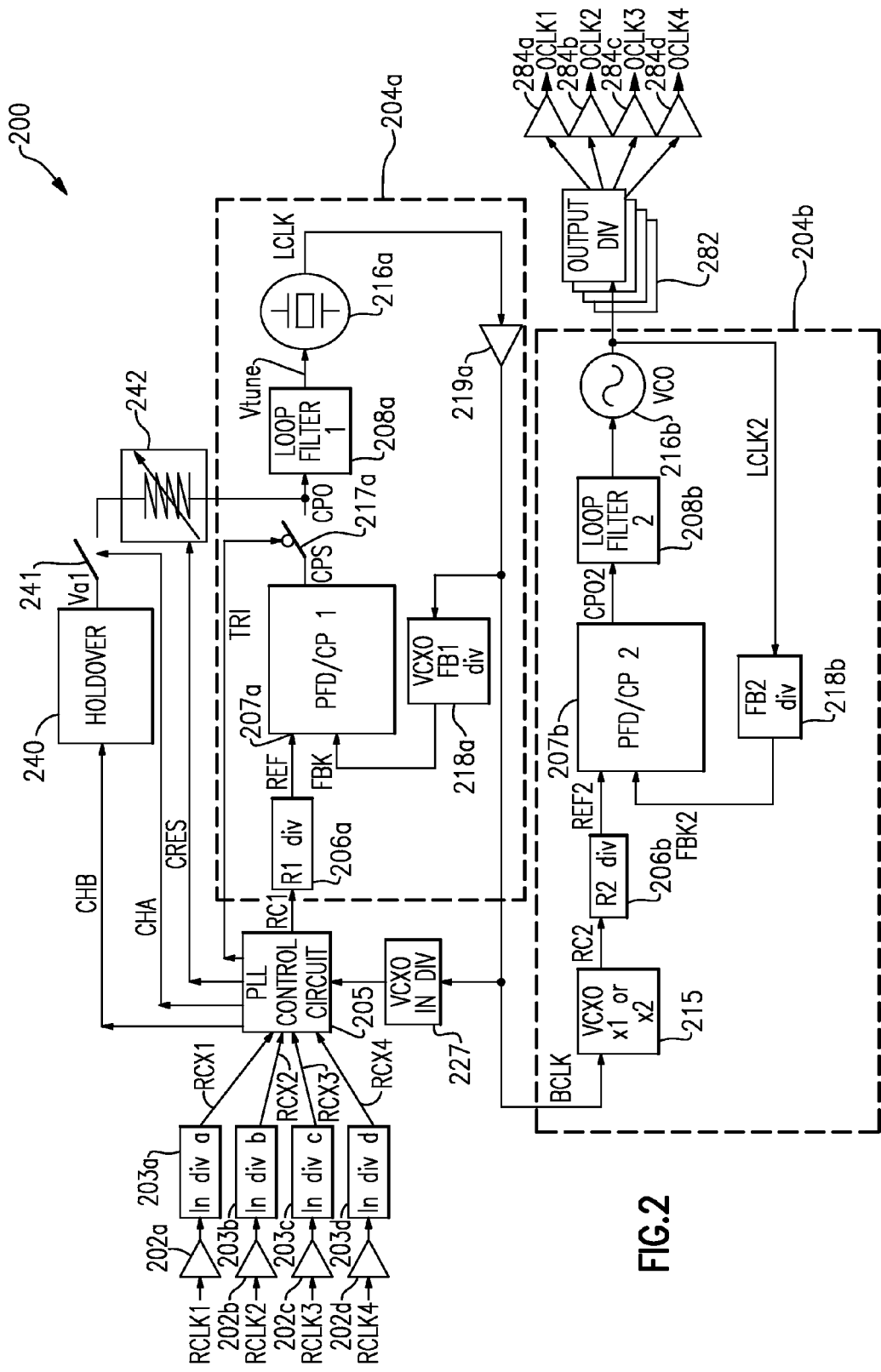
FIG. 2 is a schematic diagram of a clock generation circuit according to one embodiment.

FIG. 2 is a schematic diagram of a clock generation circuit 200 according to one embodiment. The clock generation circuit 200 includes a first PLL 204a, a second PLL 204b, a holdover circuit 240, a holdover switch 241, a variable resistor 242, a first reference clock buffer 202a, a second reference clock buffer 202b, a third reference clock buffer 202c, a fourth reference clock buffer 202d, a first reference clock divider 203a, a second reference clock divider 203b, a third reference clock divider 203c, a fourth reference clock divider 203d, a PLL control circuit 205, a first VCXO divider 227, an array of output dividers 282, a first output clock buffer 284a, a second output clock buffer 284b, a third output clock buffer 284c, and a fourth output clock buffer 284d.

In the illustrated configuration, the clock generation circuit 200 receives a first reference clock signal RCLK1, a second reference clock signal RCLK2, a third reference clock signal RCLK3, and a fourth reference clock signal RCLK4. Additionally, the illustrated clock generation circuit 200 generates a first output clock signal OCLK1, a second output clock signal OCLK2, a third output clock signal OCLK3, and a fourth output clock signal OCLK4. Although FIG. 2 illustrates a configuration in which a clock generation circuit receives four reference clock signals and generates four output clock signals, the teachings herein are applicable to clock generation circuits that receive more or fewer reference clock signals and/or that generate more or fewer output clock signals. In one embodiment, the clock generation circuit 200 receives a single reference clock signal.

As shown in FIG. 2, the first reference clock buffer 202a is used to buffer the first reference clock signal RCLK1 to generate a first buffered reference clock signal, which is divided using the first reference clock divider 203a to generate a first divided reference clock signal RCX1 for the PLL control circuit 205. Additionally, the second reference clock buffer 202b and the second reference clock divider 203b are used to buffer and divide the second reference clock signal RCLK2 to generate a second divided reference clock signal RCX2 for the PLL control circuit 205. Furthermore, the third reference clock buffer 202c and the third reference clock divider 203c are used to buffer and divide the third reference clock signal RCLK3 to generate a third divided reference clock signal RCX3 for the PLL control circuit 205. Additionally, the fourth reference clock buffer 202d and the fourth reference clock divider 203d are used to buffer and divide the fourth reference clock signal RCLK4 to generate a fourth divided reference clock signal RCX4 for the PLL control circuit 205. The illustrated configuration illustrates one example of clock signal conditioning that can occur on one or more reference clock signals before they are provided to a PLL control circuit. However, the teachings herein are applicable to other configurations, including implementations in which one or more of the reference clock signals are not conditioned.

The PLL control circuit 205 generates a first input clock signal RC1, which is provided as an input to the first PLL 204a. The first input clock signal RC1 can be generated based on a selected reference clock signal chosen from the divided reference clock signals RCX1-RCX4 by the PLL control circuit 205. The PLL control circuit 205 can be used to monitor one or more of the divided reference clock signals RCX1-RCX4 to determine when the chosen reference clock signal is unreliable.

As shown in FIG. 2, the first PLL 204a generates a local clock signal LCLK from the first input clock signal RC1. In certain configurations, the first PLL 204a can be implemented to have a relatively low loop bandwidth to provide a relatively high amount of jitter attenuation. For example, the first input clock signal RC1 can be a noisy and/or intermittent signal, and implementing the first PLL 204a with relatively low loop bandwidth can decrease jitter of the local clock signal LCLK. In the illustrated configuration, the second PLL 204b uses a buffered version of the local clock signal LCLK as a reference clock signal for frequency synthesis. Cascading two or more PLLs in this manner can aid in decreasing phase noise and/or lowering jitter in output clock signals generated by the clock generation circuit 200. Although FIG. 2 illustrates a configuration using a cascade of two PLLs, the teachings herein are applicable to clock generation circuits using more or fewer PLLs.

In the illustrated configuration, the first PLL 204 includes a first input clock divider 206a, a first phase-frequency detector and charge pump (PFD/CP) 207a, a charge pump output switch 217a, a first loop filter 208a, a VCXO 216a, a clock buffer 219a, and a first feedback divider 218a. The first input clock divider 206a divides the first input clock signal RC1 to generate a first PFD/CP reference clock signal REF. Additionally, the clock buffer 219a buffers the local clock signal LCLK to generate a buffered clock signal BCLK, which is divided using the first feedback divider 218a to generate a first feedback clock signal FBK for the first PFD/CP 207a. The first PFD/CP 207a generates a charge pump output signal (CPS), which is provided as an input to the charge pump output switch 217a. The charge pump output switch 217a receives a tristate signal TRI, which is used to selectively disable the feedback loop of the first PLL 204a. The charge pump output switch 217a further generates a loop filter input signal CPO, which is provided as an input to the first loop filter 208a. The output of the holdover circuit 240 is also electrically connected to the input of the first loop filter 208a via the holdover switch 241 and the variable resistor 242. The first loop filter 208a generates a first tuning voltage Vtune, which is provided as an input to the VCXO 216a. The VCXO 216a generates the local clock signal LCLK, which can have a frequency of oscillation that changes with a voltage level of the tuning voltage Vtune.

Although FIG. 2 illustrates a configuration in which the first PLL 204a includes the charge pump output switch 217a for selectively disabling the first PLL's feedback loop, other configurations are possible. For example, in another embodiment, the PLL control circuit 205 disables or enables the first PLL's feedback loop by providing the tristate signal TRI to the first PFD/CP 207a. For instance, the tristate signal TRI can be used to control pump up and pump down signals to turn off positive and negative current sources in the PFD/CP's charge pump when the PLL's feedback loop is disabled.

In certain configurations, the second PLL 204b can be a high frequency PLL designed to receive the buffered input clock BCLK of low frequency, for instance 122.88 MHz, and to provide a second local clock signal LCLK2 of higher frequency, for instance 2457.6 MHz, to the array of output dividers 282. The array of output dividers 282 can generate divided output clock signals, which can be buffered by the output clock buffers 284a-284d to generate a plurality of high frequency output clock signals OCLK1-OCLK4.

As shown in FIG. 2, the PLL control circuit 205 generates a variety of control signals for controlling operation of the first PLL 204a, including a tristate signal TRI, a resistance control signal CRES, a first holdover control signal CHA, and a second holdover control signal CHB.

The PLL control circuit 205 controls an operating mode of the first PLL 204a to one of a plurality of operating modes including a holdover mode and a phase locking mode. When the PLL control circuit 205 operates the first PLL 204a in the holdover mode, the PLL control circuit 205 turns on the holdover switch 241 and disables a feedback loop of the first PLL 204a by turning off the charge pump output switch 217a. Additionally, when the PLL control circuit 205 operates the first PLL 204a in the phase locking mode, the PLL control circuit 205 enables the feedback loop of the first PLL 204a by turning on the charge pump output switch 217a.

Thus, the tristate signal TRI can be used to selectively break or disable the first PLL's feedback loop. For example, when the charge pump output switch 217a is opened or turned off using the tristate signal TRI, the feedback loop of the first PLL 204a can be disabled. However, when the charge pump output switch 217a is closed or turned on using the tristate signal TRI, the charge pump output signal CPS can be provided to the first loop filter 208a. The first holdover control signal CHA can be used to open or close the holdover switch 241, thereby selectively activating an electrical path between the output of the holdover circuit 240 and the input to the first loop filter 208a. The resistance control signal CRES can be used to control a resistance value of the variable resistor 242, and can be controlled over time to provide a soft transition from the holdover mode to the phase locking mode, as will be described further below. The second holdover control signal CHB can be used to control the holdover circuit 240, including, for example, to establish a desired holdover voltage when the first PLL 204a operates in the holdover mode.

In the illustrated configuration, the second PLL 204b includes a second VCXO divider 215, a second input clock divider 206b, a second PFD/CP 207b, a second loop filter 208b, a voltage controlled oscillator (VCO) 216b, and a second feedback divider 218b. As shown in FIG. 2, the second VCXO divider 215 receives the buffered clock signal BCLK from the first PLL 204a and generates a second input clock signal RC2, which is provided as an input to the second input clock divider 206b. The second input clock divider 206b divides the second input clock signal RC2 to generate a second PFD/CP reference clock signal REF2, which is provided as an input to the second PFD/CP 207b. Including the second VCXO divider 215 can enhance the flexibility of the second PLL 204b. However, other configurations are possible, such as implementations in which the second VCXO divider 215 is omitted. The second PFD/CP 207b receives a second feedback clock signal FBK2 from the second feedback divider 218b, and generates a second loop filter input signal CPO2. The second loop filter 208b receives the second loop filter input signal CPO2, and generates a second tuning voltage for controlling an oscillation frequency of the VCO 216b. The VCO 216b generates a second local clock signal LCLK2, which is provided as an input to the second feedback divider 218b and as an input to the array of output dividers 282.

In the embodiment shown in FIG. 2, the first input clock signal RC1 is generated by the PLL control circuit 205 based on a selected reference clock signal chosen from the reference clock signals RCLK1-RCLK4, which are conditioned in this example with buffering and optional frequency dividing. As discussed earlier, all or a portion of the reference clock signals RCLK1-RCLK4 can be noisy and/or intermittent. In certain configurations, one of the reference clock signals, for instance, the first reference clock signal RCLK1, serves as a primary reference clock signal while the additional reference clock signals serve as backup reference clock signals.

The illustrated clock generation circuit 200 includes the PLL control circuit 205, which generates control signals for controlling the mode of operation of the first PLL 204a. After operating in the phase locking mode for a sufficient period of time, the first PLL 204a can be phase-locked to the first input clock signal RC1, which is generated based on a selected reference clock signal chosen from the reference clock signals RCLK1-RCLK4.

The PLL control circuit 205 can monitor one or more of the reference clock signals RCLK1-RCLK4 or clock signals derived therefrom to determine when a particular reference clock signal is valid. For example, in certain configurations, the PLL control circuit 205 monitors the first input clock signal RC1 to determine whether or not the first input clock signal RC1 is reliable. In the illustrated configuration, the PLL control circuit 205 can further receive a clock signal from the first VCXO divider 227, which can aid in determining the reliability of a reference clock signal. For example, in certain configurations, the PLL control circuit 205 can compare the clock signal from the first VCXO divider 227 to the first input clock signal RC1 to determine when the first input clock signal RC1 has become unsuitable for use as a reference. The first input clock signal RC1 can be determined to be unreliable for a variety of reasons, including, for example, when the first input clock signal RC1 has a phase noise greater than a threshold and/or when the first input clock signal RC1 does not toggle for a certain duration of time.

When the PLL control circuit 205 determines that the selected reference clock signal is unreliable, the PLL control circuit 205 can turn off the charge pump output switch 217a and turn on the holdover switch 241 to operate the first PLL 204a in the holdover mode. Although FIG. 2 illustrates a configuration that includes the holdover switch 241 for selectively operating the first PLL 204a in the holdover mode, other configurations are possible. For example, in another embodiment, the holdover switch 241 is omitted, and the PLL control circuit 205 can control the resistance of the variable resistor 242 to a high resistance value to disconnect the output of the holdover circuit 240 from the input of the first loop filter 208a. Thus, in certain configurations, the resistance of the variable resistor 242 can be controlled to selectively operate the first PLL 204a in the holdover mode.

During the holdover mode, the holdover circuit 240 can generate a holdover voltage Va1, which is provided to the input of the first loop filter 208a via the variable resistor 242 and the holdover switch 241. In this manner, the holdover voltage Va1 is provided to the input of the first loop filter 208a, and the first tuning voltage Vtune can be stabilized to inhibit the oscillation frequency of the VCXO 216a from changing. During the holdover mode, the PLL control circuit 205 can change or update the reference clock signal, such that the first input clock signal RC1 is generated by the chosen reference clock signal. Although FIG. 2 illustrates a configuration in which the holdover switch 241 is electrically connected between the output of the holdover circuit 240 and the variable resistor 242, the teachings herein are applicable to other configurations, such as configurations in which the variable resistor 242 is electrically connected between the output of the holdover circuit 240 and the holdover switch 241. Thus, the order of the holdover switch 241 and the variable resistor 242 in the series can be reversed.

Once the first input clock signal RC1 becomes valid, the PLL control circuit 205 can control the first PLL 204a to reacquire phase lock by transitioning the first PLL 204a from the holdover mode to the phase locking mode. To inhibit transient changes to the tuning voltage Vtune during the transition from holdover to reacquiring phase lock, the PLL control circuit 205 controls a resistance of the variable resistor 242 over time to provide a soft transition from the holdover mode to the phase locking mode.

In particular, the PLL control circuit 205 can maintain both the holdover switch 241 and the charge pump output switch 217a turned on, and can increase the resistance of the variable resistor 242 over time to provide the first PFD/CP 207a with increasingly greater control over the voltage level of the tuning voltage Vtune. For example, the PLL control circuit 205 can incrementally increase the variable resistor's resistance over time such that a greater amount of the charge generated at the output of the first PFD/CP 207a reaches the input of the first loop filter 208a. Configuring the first PLL 204a to have a soft transition from holdover to reacquiring phase lock can prevent large voltage perturbations in the tuning voltage Vtune during the transition from the holdover mode to the phase locking mode. In contrast, a PLL that operates without soft transition may have a VCO tuning voltage that reaches a power high or power low supply voltage rail during the transition.

When the first PLL 204a has reacquired phase lock to the first input clock signal RC1, the PLL control circuit 205 can turn off or open the holdover switch 241 while maintaining the charge pump output switch 217a closed. Thus, the PLL control circuit 205 can return the first PLL 204a to normal operation once phase lock has been reacquired.

Figure 3:
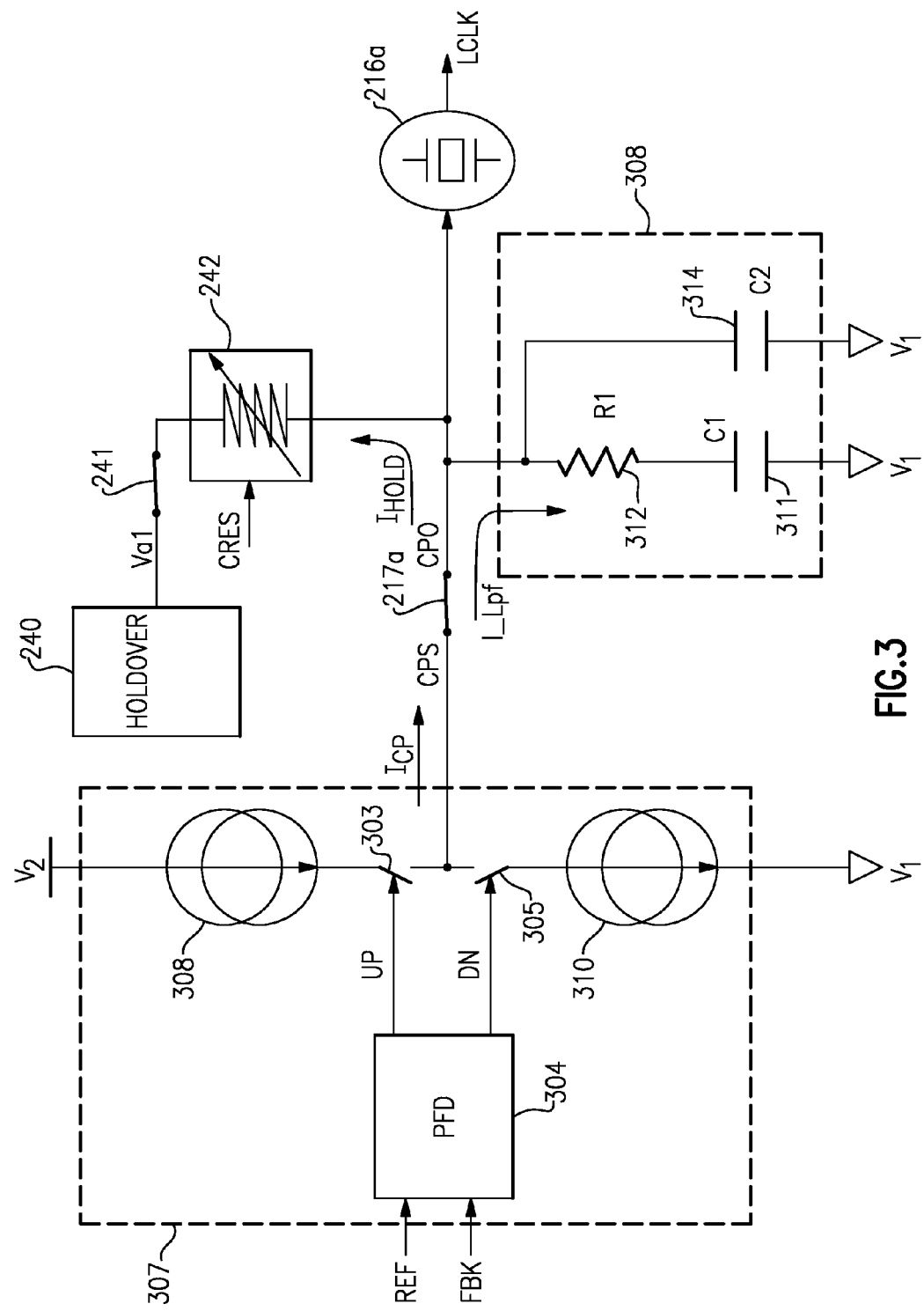
FIG. 3 is a schematic diagram of a portion of a clock generation circuit according to one embodiment.

FIG. 3 is a schematic diagram of a portion of a clock generation circuit according to one embodiment. The illustrated diagram includes the VCXO 216a, the charge pump output switch 217a, the holdover circuit 240, the holdover switch 241, and the variable resistor 242, which can be as described earlier. The illustrated diagram further includes a PFD/CP 307 and a loop filter 308.

In the illustrated embodiment, the loop filter 308 includes a first capacitor 311 (C1), a first resistor 312 (R1), and a second capacitor 314 (C2). The first resistor 312 and the first capacitor 311 are electrically connected in series between an input of the loop filter 308 and a power low supply voltage $V_1$, and the second capacitor 314 is electrically connected in parallel to the series combination of the first resistor 312 and the first capacitor 311 between the loop filter's input and the power low supply voltage $V_1$. Although the loop filter 308 illustrates one example of a suitable loop filter for a PLL, the teachings herein are applicable to other configurations of loop filters, including, for example, active loop filters or passive loop filters.

The illustrated PFD/CP 307 includes a phase-frequency detector (PFD) 304, a first or positive current source 308, a second or negative current source 310, a first current source switch 303, and a second current source switch 305. The PFD 307 compares timing of the PFD/CP reference clock signal REF to timing of the first feedback clock signal FBK to generate a pump up signal UP and a pump down signal DOWN, which control the first and second current source switches 303, 305, respectively. As shown in FIG. 3, the positive current source 308 is electrically connected in series with the first current source switch 303 between a power high supply voltage $V_2$ and the output of the PFD/CP 307, and the negative current source 310 is electrically connected in series with the second current source switch 305 between the power low supply voltage $V_1$ and the output of the PFD/CP 307. The positive current source 308 is operable to source current and the negative current source 310 is operable to sink current, and the PFD 304 controls the first and second current source switches 303, 305 using the pump up signal UP and the pump down signal DOWN to control a charge pump output current $I_{CP}$ generated by the PFD/CP 307.

Thus, when the pump up signal UP turns on the first current source switch 303, current can be sourced from the positive current source 308 through the output of the PFD/CP 307, and when the pump down signal DN turns on the second current source switch 305, current can be sunk from the negative current source 310 through the PFD/CP's output. Although the PFD/CP 307 illustrates one example of a suitable PFD/CP for a PLL, the teachings herein are applicable to other configurations of phase-frequency detectors and/or charge pumps.

In the illustrated configuration, both the holdover switch 241 and the charge pump output switch 217a are illustrated in the closed or turned on state. As shown in FIG. 3, the charge pump output current $I_{CP}$ can correspond to a sum of a loop filter input current I_Lpf flowing into the loop filter 208a and a holdover current $I_{HOLD}$ flowing into the holdover circuit 240. In the illustrated configuration, the VCXO 216a is implemented with high input impedance, and a current flowing into the input of the VCXO 216a is relatively small and not shown. However, other configurations are possible.

As shown in FIG. 3, the variable resistor 241 is electrically connected between the output of the holdover circuit 240 and the input of the loop filter 308. Thus, when the resistance of the variable resistor 242 is increased from a first resistance value to a second resistance value using the resistance control signal CRES, a larger fraction of the charge pump current $I_{CP}$ can flow into the input of the loop filter 308 relative to the output of the holdover circuit 240. Thus, the resistance of the variable resistor 242 can be controlled to control a ratio of the loop filter input current I_Lpf to the holdover current $I_{HOLD}$.

As described earlier, a PLL control circuit (for example, the PLL control circuit 205 of FIG. 2) can provide a PLL with a soft transition from holdover to reacquiring phase lock. In particular, the PLL control circuit can close both the holdover switch 241 and the charge pump output switch 217a, and gradually increase the resistance of the variable resistor 242 to reduce a fraction of the charge pump current $I_{CP}$ that flows into or out of the holdover circuit 240 over time. Thus, control over the oscillation frequency of the VCXO 216a can be gradually passed from the holdover circuit 240 to the PFD/CP 307 to reduce frequency perturbations during the transition from holdover to reacquiring phase lock.

In one embodiment, when transitioning from holdover to reacquiring phase lock, a PLL control circuit (for example, the PLL control circuit 205 of FIG. 2) initially controls the resistance control signal CRES to set the variable resistor's resistance to an initial or low resistance value. Thereafter, the PLL control circuit incrementally increases the resistance of the variable resistor 242 using the resistor control signal CRES from the low resistance value to a final or large resistance value. In certain configurations, the large resistance value is at least a factor of 10,000 times greater than the low resistance value. In this manner, the holdover current $I_{HOLD}$ transitions from a large fraction of the charge pump current $I_{CP}$ to a small fraction of the charge pump current $I_{CP}$ over time to provide a soft transition. Providing soft transition in this manner can inhibit large variation in the loop filter's input voltage.

As shown in FIG. 3, the holdover circuit 240 can provide a holdover voltage Va1 at an output of the holdover circuit 240. The holdover voltage Va1 can be controlled to a desired loop filter input voltage. In one embodiment, the holdover circuit 240 generates the holdover voltage Va1 based on monitoring the input voltage of the loop filter 308.

Figure 4:
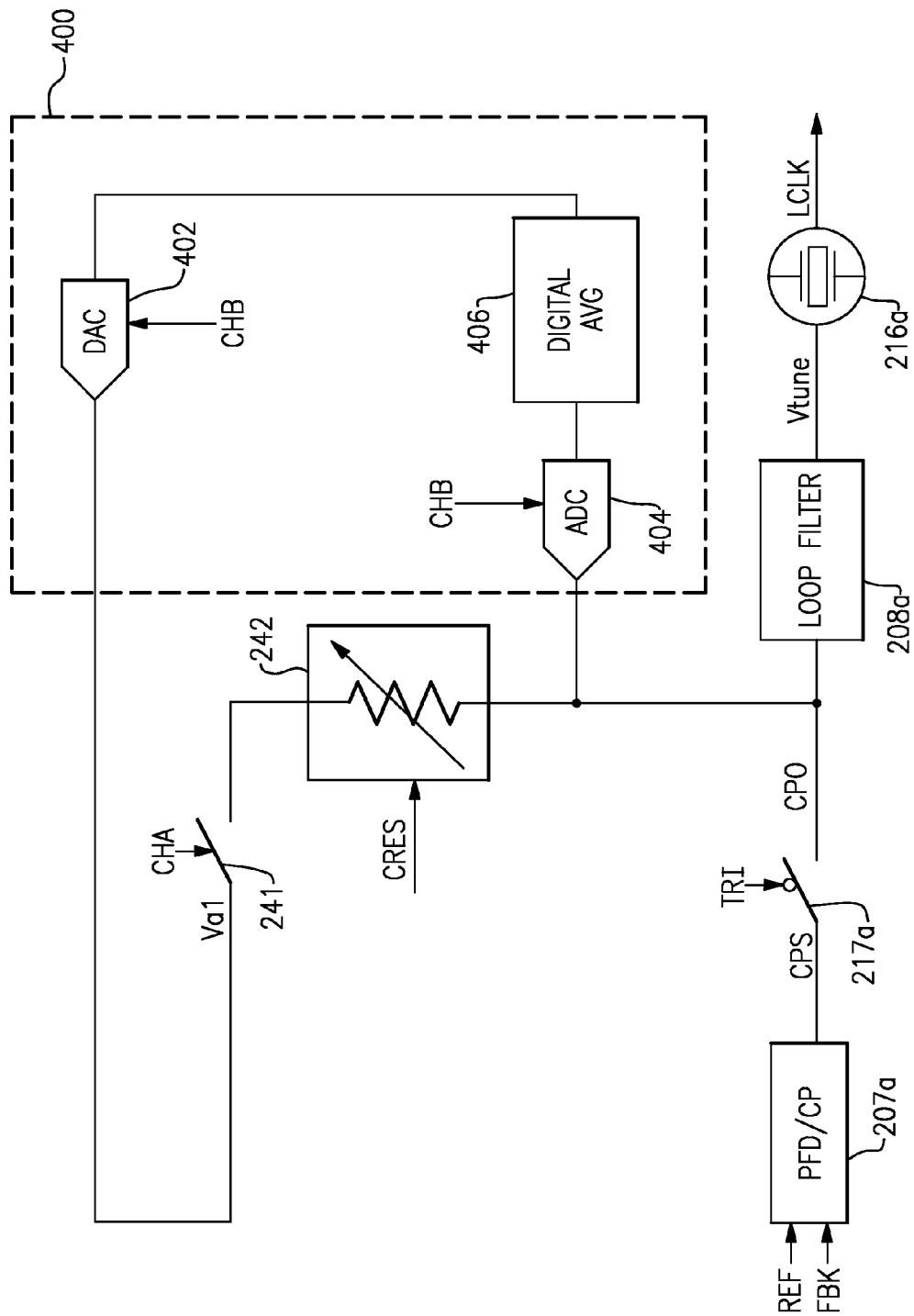
FIG. 4 is a schematic diagram of a portion of a clock generation circuit according to another embodiment.

FIG. 4 is a schematic diagram of a portion of a clock generation circuit according to another embodiment. The illustrated diagram includes the first PFD/CP 207a, the first loop filter 208a, the VCXO 216a, the charge pump output switch 217a, the holdover switch 241, and the variable resistor 242, which can be as described earlier. The illustrated diagram further includes a holdover circuit 400.

The illustrated holdover circuit 400 includes an analog-to-digital converter (ADC) 404, a digital averaging circuit 406, and a digital-to-analog converter 402. As shown in FIG. 4, the DAC 402 and the ADC 404 receive the second holdover control signal CHB, which can be used to control conversion operations of the DAC 402 and the ADC 404.

During normal PLL operation, the ADC 404 and the digital average 402 can be used to generate a digital representation of the average loop filter voltage at the input of the loop filter 208a. The holdover circuit 400 can use the average loop filter voltage to generate the holdover voltage Va1 when the PLL is operated in the holdover mode. For example, the DAC 402 can be used to convert the digital representation of the average loop filter voltage to the holdover voltage Va1. Thus, in the illustrated embodiment, the holdover voltage Va1 corresponds to an average value of the input voltage to the loop filter 208a over a window of time. In certain configurations, the second holdover control signal CHB can be used to maintain the holdover voltage Va1 substantially constant during the holdover mode.

Although FIG. 4 illustrates one embodiment of a holdover circuit, the teachings herein are applicable to other configurations of holdover circuits.

Figure 5:
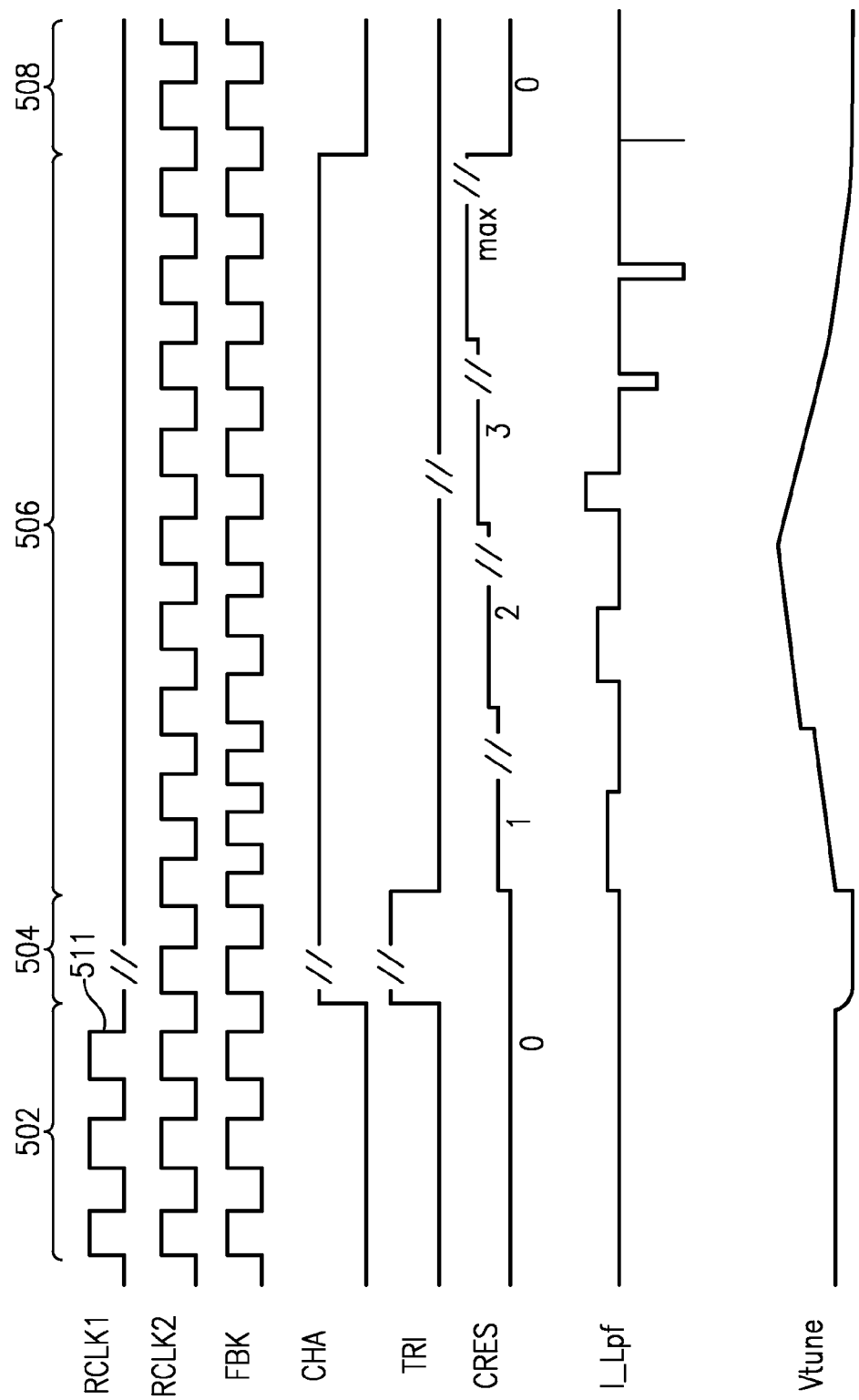
FIG. 5 is a timing diagram for a clock generation circuit in accordance with one embodiment.

FIG. 5 is a timing diagram for a clock generation circuit in accordance with one embodiment.

The illustrated timing diagram includes a first plot of a first reference clock signal RCLK1, a second plot of a second reference clock signal RCLK2, a third plot of a feedback clock signal FBK, a fourth plot of a first holdover control signal CHA, a fifth plot of a tristate signal TRI, a sixth plot of a resistance control signal CRES, a seventh plot of a loop filter input current I_Lpf, and an eight plot of a tuning voltage Vtune. The illustrated timing diagram illustrates one example of timing of the clock generation circuit 200 of FIG. 2. However, the clock generation circuit 200 of FIG. 2 can operate using other timing schemes.

The timing diagram has been annotated to mark a first time interval 502 in which the first PLL 204a of FIG. 2 operates normally with the holdover switch 241 turned off and the feedback loop of the first PLL 204a enabled. Additionally, the timing diagram has been annotated to mark a second time interval 504, corresponding to when the first PLL 204a of FIG. 2 operates in a holdover mode. Furthermore, the timing diagram includes a third time interval 506 in which a soft transition to reacquiring phase lock is provided, and a fourth time interval 508 in which the first PLL 204a returns to normal operation.

During the first time interval 502, the PLL control circuit 205 of FIG. 2 generates the first input clock signal RC1 based on the first reference clock signal RCLK1. As shown in FIG. 5, the first reference clock signal RCLK1 becomes unreliable and no longer toggles at a time 211. After the PLL control circuit 205 determines that the first reference clock signal RCLK1 is unreliable, the PLL control circuit 205 operates the first PLL 204a in the holdover mode by controlling the first holdover control signal CHA and the tristate signal TRI to turn on the holdover switch 241 and turn off the charge pump output switch 217a. As shown in FIG. 5, the resistor control signal CRES has an initial or zero setting during the holdover mode.

As shown by the third time interval 506 of FIG. 5, the PLL control circuit 205 of FIG. 2 closes the charge pump output switch 217*a* and gradually increments the resistance value of the variable resistor 242 over time. In the illustrated configuration, the PLL control circuit 205 provides a soft transition between holdover and reacquiring phase lock by gradually incrementing the resistor control signal CRES from the initial value (0) to a maximum value (max). Thereafter, the PLL control circuit 205 turns off the holdover switch 241 to return the first PLL 204*a* to normal operation.

As discussed earlier, changes in the loop filter input voltage affect the tuning voltage Vtune. As shown in FIG. 5, at the start of the second time interval 504, the tuning voltage Vtune changes slightly. This change in the tuning voltage Vtune can correspond to a difference in the holdover voltage Va1 relative to a voltage level of the tuning voltage Vtune during phase lock.

The third time interval 506 shows the sequence of waveforms in transitioning from holdover to reacquiring phase lock. As shown by the third time interval 506 of FIG. 5, the loop filter input current I_Lpf initially is low and of long duration. Additionally, the peak loop filter input current I_Lpf increases over time but is active for a shorter duration as the first PLL 204*a* of FIG. 2 becomes closer to acquiring phase lock. In the illustrated configuration, the maximum variation of the tuning port voltage can be, for example, within 50 mV.

Applications

Devices employing the above described clock generation circuits can be implemented into various electronic devices. Examples of the electronic devices can include, but are not limited to, consumer electronic products, parts of the consumer electronic products, electronic test equipment, etc. Examples of the electronic devices can also include circuits of optical networks or other communication networks. The consumer electronic products can include, but are not limited to, an automobile, a camcorder, a camera, a digital camera, a portable memory chip, a washer, a dryer, a washer/dryer, a copier, a facsimile machine, a scanner, a multifunctional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
    a first phase-locked loop (PLL) comprising a loop filter, wherein the first PLL is configured to receive an input clock signal;
    a control circuit configured to receive one or more reference clock signals and to generate the input clock signal based on the one or more reference clock signals, wherein the control circuit is further configured to control the first PLL to one of a plurality of operating modes comprising a holdover mode in which a feedback loop of the first PLL is disabled, and a phase locking mode in which the feedback loop of the first PLL is enabled;
    a holdover circuit configured to control an input to the loop filter in the holdover mode; and
    wherein the control circuit is further configured to gradually phase out operation of the holdover circuit when transitioning from the holdover mode to the phase locking mode.

2. The apparatus of claim 1, wherein the control circuit is further configured to generate the input clock signal based on a selected reference clock signal chosen from two or more reference clock signals, and to change the selected reference clock signal and operate the first PLL in the holdover mode in response to detecting that the selected reference clock signal is not reliable.

3. The apparatus of claim 1, wherein the first PLL further comprises a charge pump and a charge pump output switch electrically connected between an output of the charge pump and the input of the loop filter, wherein the control circuit enables or disables the feedback loop of the first PLL based on turning on or off the charge pump output switch.

4. The apparatus of claim 1, wherein the first PLL is configured to generate a first output clock signal from the input clock signal, wherein the apparatus further comprises a second PLL configured to generate a second output clock signal based on the first output clock signal.

5. The apparatus of claim 1, wherein the first PLL further comprises:
    an input divider configured to receive the input clock signal and to generate a divided clock signal;
    a phase-frequency detector (PFD) configured to generate a plurality of charge pump control signals based on comparing the divided clock signal to a feedback clock signal;
    a charge pump configured to generate a charge pump current at an output based on the plurality of charge pump control signals;
    a charge pump output switch electrically connected between the output of the charge pump and the input of the loop filter;
    a voltage controlled oscillator configured to receive a tuning voltage from the loop filter and to generate a local clock signal; and
    a feedback divider configured to generate the feedback clock signal based on the local clock signal.

6. The apparatus of claim 1, wherein the holdover circuit comprises a digital-to-analog converter (DAC) configured to generate a holdover voltage that controls the input to the loop filter in the holdover mode.

7. The apparatus of claim 6, wherein the holdover circuit further comprises:
    an analog-to-digital converter (ADC) configured to convert a voltage at the input of the loop filter to a digital signal; and a digital averaging circuit configured to average the digital signal over a time interval to generate an averaged signal, wherein the DAC is configured to receive the averaged signal.

8. The apparatus of claim 1, further comprising a variable resistor electrically connected between an output of the holdover circuit and the input of the loop filter, wherein the control circuit is further configured to change a resistance of the variable resistor when transitioning from the holdover mode to the phase locking mode.

9. The apparatus of claim 8, further comprising a holdover switch in series with the variable resistor, wherein the control circuit is configured to turn on the holdover switch during the holdover mode, and is further configured to enable the feedback loop of the first PLL and maintain the holdover switch turned on when transitioning from the holdover mode to the phase locking mode.

10. The apparatus of claim 9, wherein the control circuit is further configured to gradually increase the resistance of the variable resistor when transitioning from the holdover mode to the phase locking mode to provide a soft transition between the holdover mode and the phase locking mode.

11. The apparatus of claim 10, wherein the control circuit is further configured to turn off the holdover switch after the soft transition.

12. The apparatus of claim 1, further comprising a charge pump configured to generate a charge pump current, wherein the control circuit is further configured to control a first amount of the charge pump current flowing into the input of the loop filter relative to a second amount of the charge pump current flowing into the holdover circuit.

13. A method of clock signal generation, the method comprising: generating an input clock signal for a phase-locked loop (PLL) using a control circuit;
controlling the PLL to one of a plurality of operating modes using the control circuit, the plurality of operating modes including a holdover mode in which a feedback loop of the PLL is disabled and a phase locking mode in which the feedback loop of the PLL is enabled;
controlling an input of a loop filter of the PLL using a holdover circuit in the holdover mode; and
gradually phasing out operation of the holdover circuit when transitioning from the holdover mode to the phase locking mode.

14. The method of claim 13, further comprising changing a resistance of a variable resistor when transitioning from the holdover mode to the phase locking mode, the variable resistor electrically connected between an output of the holdover circuit and the input of the loop filter.

15. The method of claim 14, further comprising turning on a holdover switch during the holdover mode, the holdover switch electrically connected in series with the variable resistor, and enabling the feedback loop of the PLL and maintaining the holdover switch turned on when transitioning from the holdover mode to the phase locking mode.

16. The method of claim 15, further comprising gradually increasing the resistance of the variable resistor when transitioning from the holdover mode to the phase locking mode to provide a soft transition between the holdover mode and the phase locking mode.

17. The method of claim 16, further comprising turning off the holdover switch after the soft transition.

18. The method of claim 15, further comprising: selecting a reference clock signal from two or more reference clock signals using the control circuit, determining whether or not the selected reference clock signal is reliable, and operating the PLL in the holdover mode and changing the selected reference clock signal when the selected reference clock signal is not reliable.

19. The method of claim 13, further comprising generating a charge pump current, and using the control circuit to control a first amount of the charge pump current flowing into the input of the loop filter relative to a second amount of the charge pump current flowing into the holdover circuit.

20. A clock system comprising:
a phase-locked loop (PLL) comprising a loop filter, wherein the PLL is configured to receive an input clock signal;
a control circuit configured to receive one or more reference clock signals and to generate the input clock signal, wherein the control circuit is further configured to control the PLL to one of a plurality of operating modes comprising a holdover mode and a phase locking mode;
a holdover circuit configured to generate a holdover voltage at an output; and
a variable resistor electrically connected between the output of the holdover circuit and an input to the loop filter, wherein the control circuit is further configured to control a resistance of the variable resistor, wherein the control circuit is further configured to change the resistance of the variable resistor when transitioning from the holdover mode to the phase locking mode.

21. The clock system of claim 20, wherein the control circuit is further configured to gradually increase the resistance of the variable resistor when transitioning from the holdover mode to the phase locking mode to provide a soft transition between the holdover mode and the phase locking mode.

22. The clock system of claim 21, further comprising a holdover switch in series with the variable resistor, wherein the control circuit is configured to turn on the holdover switch during the holdover mode, and is further configured to enable the feedback loop of the PLL and maintain the holdover switch turned on when transitioning from the holdover mode to the phase locking mode.

23. The clock system of claim 20, wherein the control circuit is further configured to generate the input clock signal based on a selected reference clock signal chosen from two or more reference clock signals.

24. The clock system of claim 23, wherein the control circuit is further configured to change the selected reference clock signal and operate the PLL in the holdover mode in response to detecting that the selected reference clock signal is not reliable.

* * * * *